United States Patent
Lin

(10) Patent No.: US 6,790,539 B2
(45) Date of Patent: Sep. 14, 2004

(54) ORGANIC ELECTROLUMINESCENCE ELEMENT

(75) Inventor: Tung-Shen Lin, Tainan (TW)

(73) Assignee: Lightronik Technology Inc., Tainan (TW)

( * ) Notice: Subject to any disclaimer, the term of this patent is extended or adjusted under 35 U.S.C. 154(b) by 0 days.

(21) Appl. No.: 10/197,825

(22) Filed: Jul. 19, 2002

(65) Prior Publication Data

US 2004/0013903 A1 Jan. 22, 2004

(51) Int. Cl.$^7$ .............................................. H05B 33/12
(52) U.S. Cl. ........................ 428/690; 428/917; 313/504; 313/506
(58) Field of Search ............................... 428/690, 917; 313/504, 506; 252/301.16

(56) References Cited

U.S. PATENT DOCUMENTS

| | | | |
|---|---|---|---|
| 3,935,031 A | 1/1976 | Adler | 136/206 |
| 4,127,412 A | 11/1978 | Rule et al. | 96/1 PC |
| 4,356,429 A | 10/1982 | Tang | 313/503 |
| 4,769,292 A | 9/1988 | Tang et al. | 428/690 |
| 5,281,489 A * | 1/1994 | Mori et al. | 428/690 |
| 6,074,734 A | 6/2000 | Kawamura et al. | 428/220 |
| 6,093,864 A | 7/2000 | Tokailin et al. | 585/25 |
| 2003/0165712 A1 * | 9/2003 | Lin et al. | 428/690 |
| 2003/0180573 A1 * | 9/2003 | Conley | 428/690 |

FOREIGN PATENT DOCUMENTS

| | | |
|---|---|---|
| JP | 2001-118683 A * | 4/2001 |
| JP | 2001-291590 A * | 10/2001 |

OTHER PUBLICATIONS

C. W. Tang, et al. "*Organic Electroluminescent Diodes*", Appl. Phys. Lett. 51, Sep. 1987, pp. 913–915.

C. W. Tang, et al. "*Organic Electroluminescence of Doped Organic Thin Films*", J. Appl. Phys. 65, May 1989, pp. 3610–3616.

* cited by examiner

*Primary Examiner*—Marie Yamnitzky
(74) *Attorney, Agent, or Firm*—Intellectual Property Solutions, Incorporated

(57) ABSTRACT

An organic EL device which contains an anode, a cathode, and at least one organic thin-film layer including a light emitting layer which contains a compound represented by the following general formula (1):

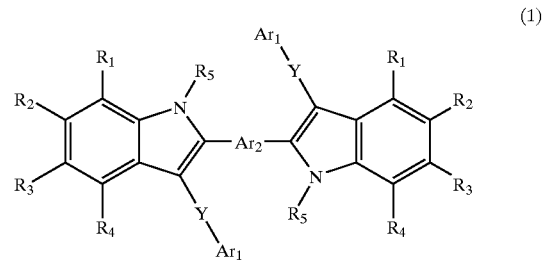

(1)

wherein $Ar_1$, $Ar_2$ represent a substituted or unsubstituted aromatic hydrocarbon group, or a substituted or unsubstituted aromatic heterocyclic group; Y represents a single bond or —CH=CH— group; R1 to R4 represent each independently a hydrogen, a halogen, a cyano group, a substituted amino group, a substituted alkoxy group, a substituted or unsubstituted alkyl group, a substituted or unsubstituted aromatic hydrocarbon group, or a substituted or unsubstituted aromatic heterocyclic group; any two of R1 to R4 may form a ring; R5 represents a substituted or unsubstituted alkyl group, a substituted or unsubstituted aromatic hydrocarbon group, or a substituted or unsubstituted aromatic heterocyclic group.

2 Claims, 10 Drawing Sheets

ORGANIC ELECTROLUMINESCENCE ELEMENT

BACKGROUND OF THE INVENTION FIELD OF THE INVENTION

This invention generally relates to a light emitting device, and more specifically to an organic electroluminescent device of a blue luminescent material having an indole skeleton and good light-emitting properties.

DESCRIPTION OF THE RELATED ART

The organic electroluminescent device (organic EL device) is a light emitting device, containing a fluorescent material which emits light in response to the recombination of hole and electron injected from anode and cathode (C. W. Tang et al. Applied Physics Letters, 51,913 (1987)). Luminescence efficiency can be improved through a method of doping a fluorescent dye. An organic EL device with a coumarin dye as the doping material (Applied Physics Letters, 65,3610 (1989)) can be used to greatly improve the luminescence efficiency. A C-545T (U.S. Pat. No. 4,769,292), which is a well-known coumarin dye, has the following structure:

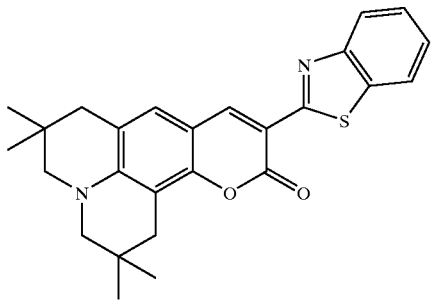

For improving the recombination efficiency of the injected hole and electron, multi-layered devices have been introduced. A hole transporting layer (HTL) containing hole transporting material (HTM) is used to improve the hole injection and transporting from the anode into the organic layer. An NPB (4-4'-bis [N-(1-naphthyl)-N-phenyl-amino-] bisphenyl), which is a well-known HTM, has the structure:

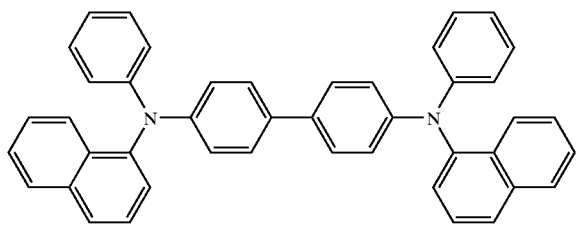

An electron transporting layer (ETL) consisting of an electron transporting material (ETM) is used to improve the electron injection from the cathode into the organic layer. An Alq$_3$ (aluminum tris (8-hydroxyquinolate)), which is a typical ETM, has the following structure:

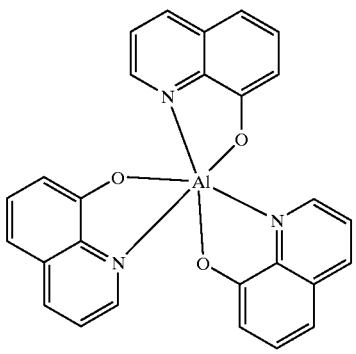

Other materials such as oxadiazole compounds, triazine compounds and triazole compounds also can be used as ETM.

Aromatic dimethylidyne compounds have been used as the blue light emissive material for the organic EL device (U.S. Pat. No. 6,093,864). One example is DPVBi (1,4-bis (2,2-di-phenylvinyl)biphenyl with an EL peak at about 485 nm., having the following structure:

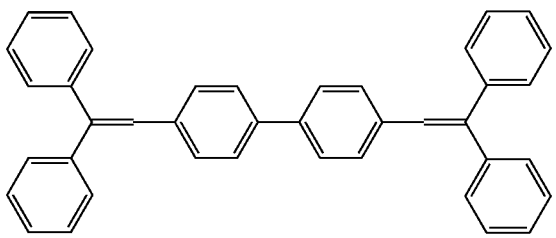

SUMMARY OF THE INVENTION

An object of the present invention is to provide a material having an indole skeleton and to provide an organic EL device having blue luminescence. The organic EL device comprises an anode, cathode, and one or more organic thin film layers which contain, either singly or as a mixture, an indole compound represented by the following general formula (1):

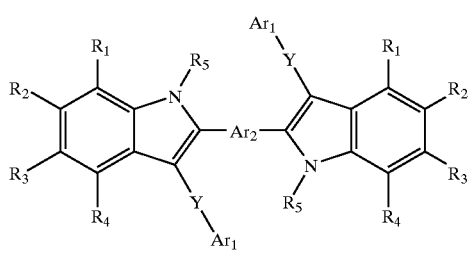

wherein Ar$_1$, Ar$_2$ represent a substituted or unsubstituted aromatic hydrocarbon group, or a substituted or unsubstituted aromatic heterocyclic group; Y represents a single bond or —CH═CH— group; R1 to R4 each independently represents a hydrogen, a halogen, a cyano group, a substituted amino group, a substituted alkoxy group, a substituted or unsubstituted alkyl group, a substituted or unsubstituted aromatic hydrocarbon group, or a substituted or unsubstituted aromatic heterocyclic group; any two of R1 to R4 may form a ring; R5 represents a substituted or unsubstituted alkyl group, a substituted or unsubstituted aromatic hydrocarbon group, or a substituted or unsubstituted aromatic heterocyclic group.

DETAILED DESCRIPTION OF THE INVENTION

Figure 1:
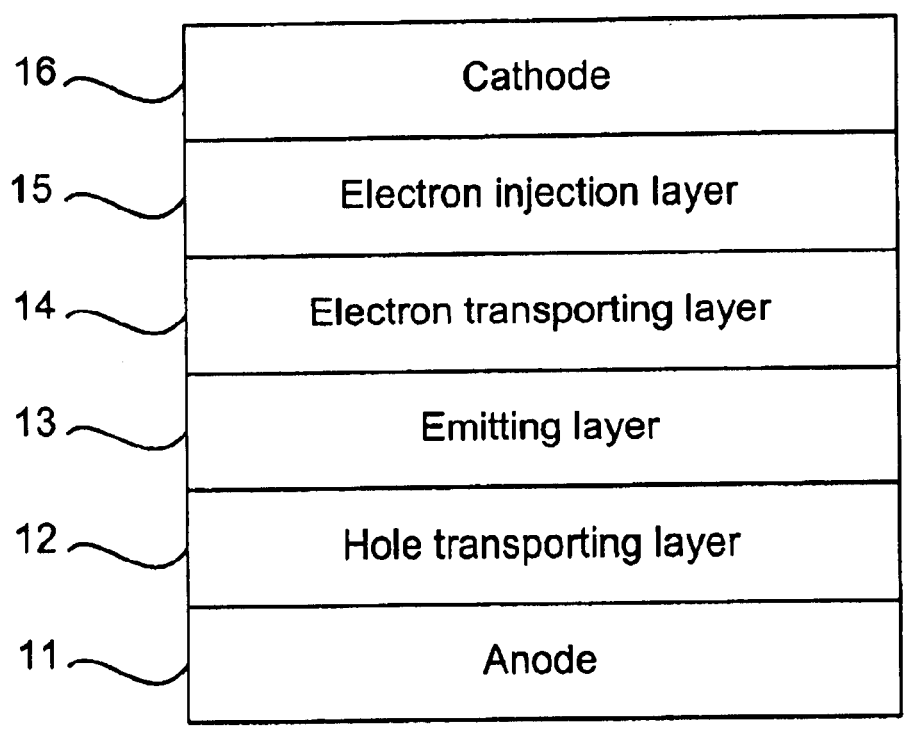
FIG. 1 illustrates a construction of an organic EL element of the present invention.
Figure 2:
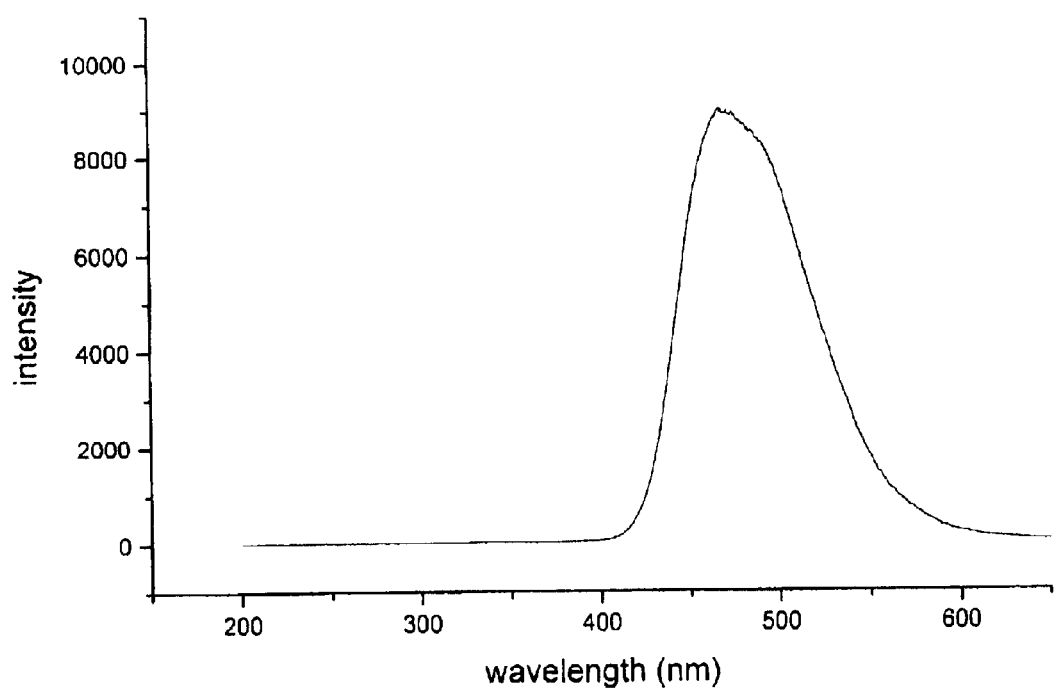
FIG. 2 illustrates the solid state PL spectrum of compound (1-1)

The present invention will hereinafter be described in detail.

In the present invention, an organic EL element contains light emitting material having indole skeleton, represented by the general formula (1) (wherein $Ar_1$, $Ar_2$, Y, R1 to R5 have the same meaning as above):

(1)

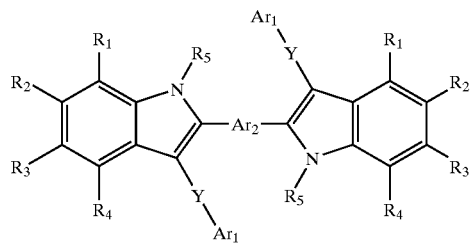

These indole based compounds with the following structure (A) have fluorescent properties in solid state (wherein $R_1$ to $R_4$, $R_5$, Y, $Ar_1$ and $Ar_2$ have the same meaning as above):

(A)

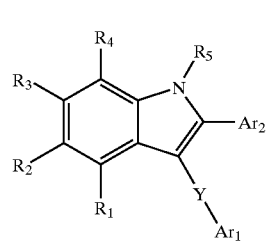

In order to enhance the fluorescent properties, the two indole-based units are connected with $Ar_2$ group. For Improving the hole-transporting or electron-transporting properties, R5 of formula (1) and formula (A) can be substituted with hole-transporting group or electron-transporting group.

Examples of the structure are shown hereinbelow:

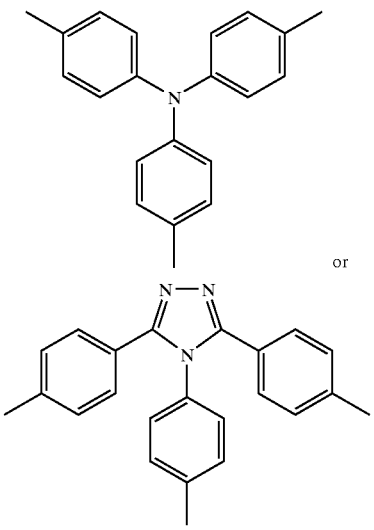

or

Examples of the indole-based compounds are shown below.

(1-1)

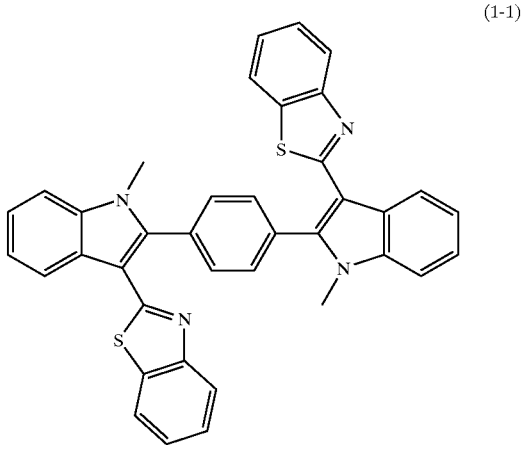

(1-2)

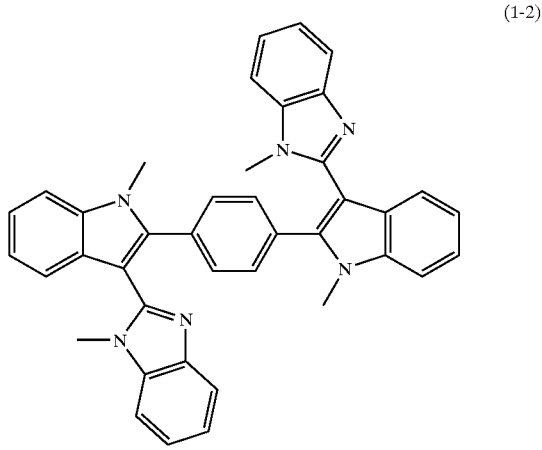

(1-3)
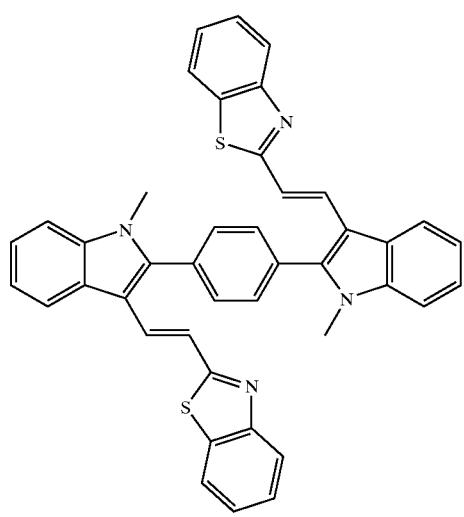
(1-4)
(1-5)
(1-6)
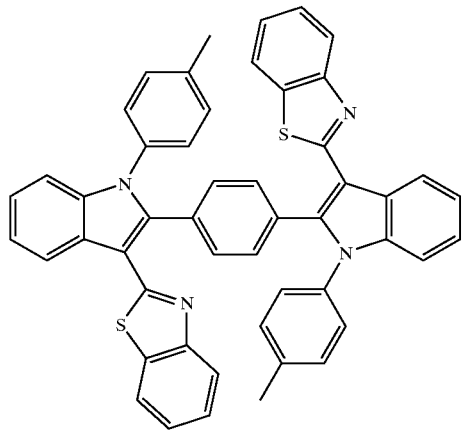
(1-7)
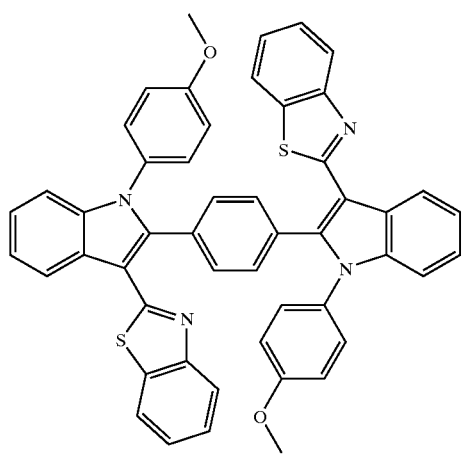
(1-8)
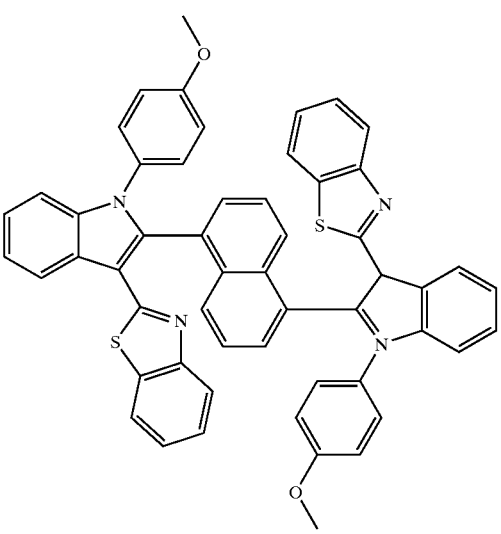

(1-9)
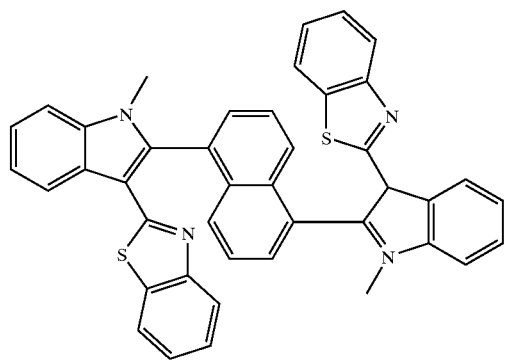
(1-13)
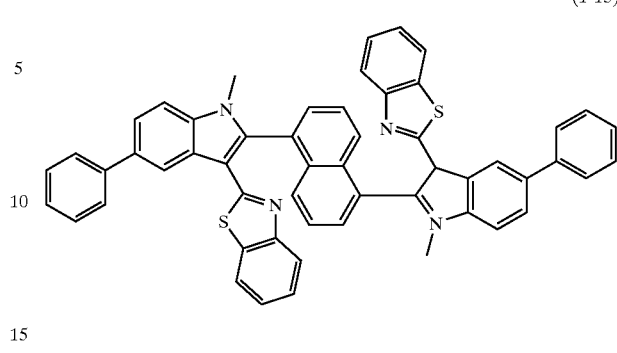
(1-10)
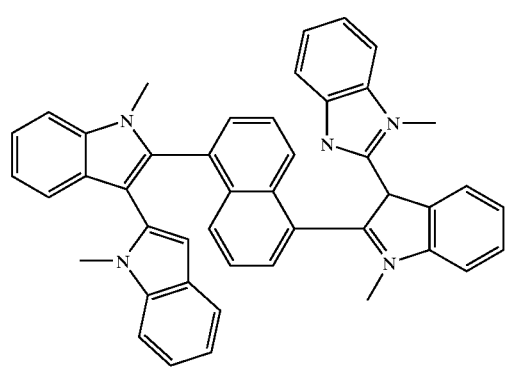
(1-14)
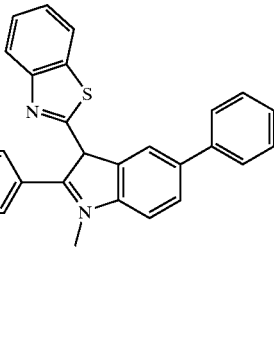
(1-11)
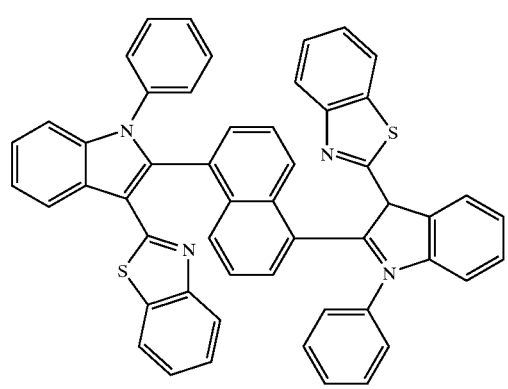
(1-15)
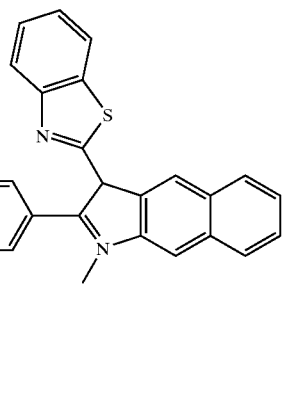
(1-12)
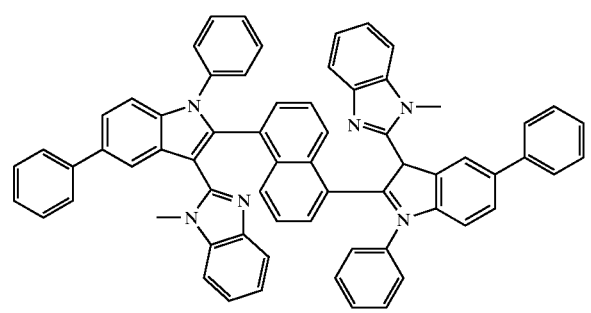
(1-16)
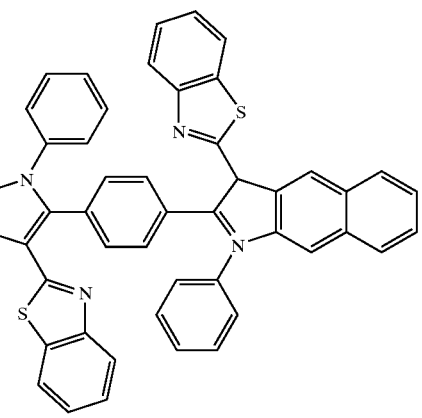

(1-17)
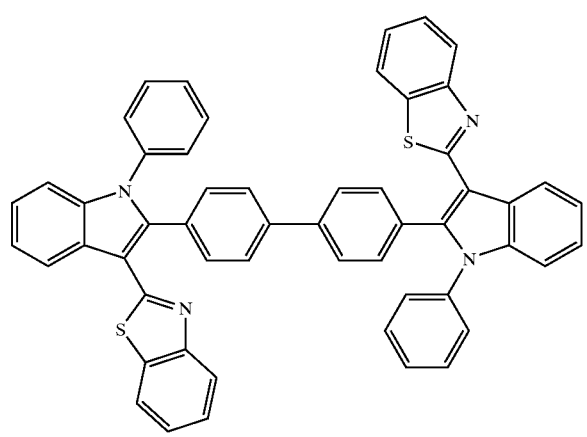
(1-18)
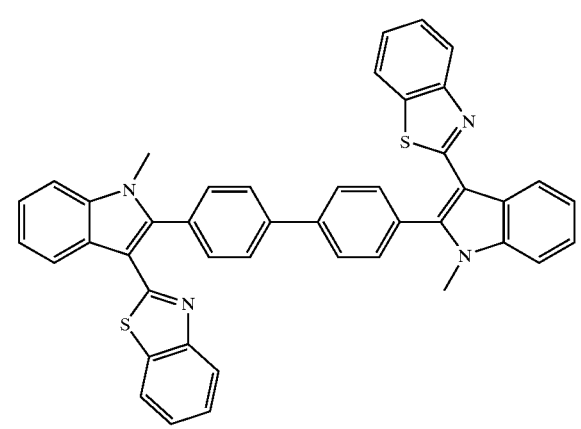
(1-19)
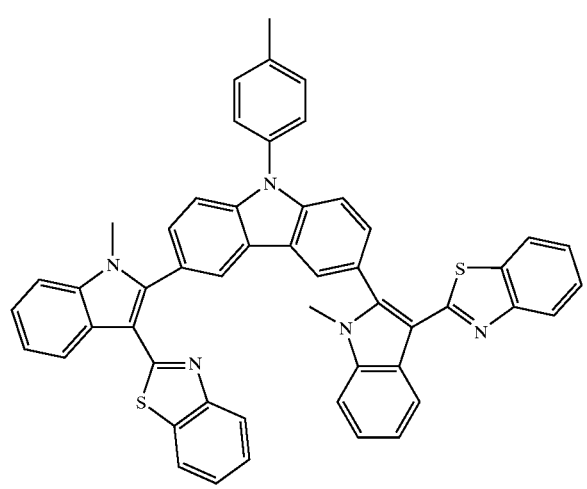
(1-20)
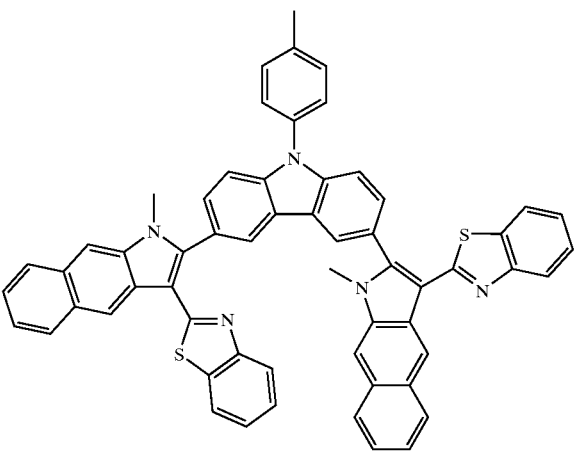
Referring to the following reaction schemes, synthesis methods to obtain the indole compound represented by the formula (1) of the present invention will be described. The main skeleton of the indole compounds can be formed by the following scheme (1) (wherein $R_1$ to $R_4$ and $Ar_2$ are the same as defined above):
(Scheme 1)
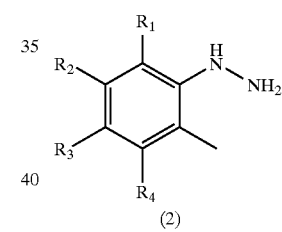
(2)
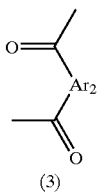
(3)
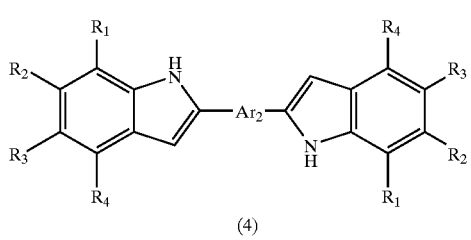
(4)

Hydrazine compounds (represented by the general formula 2) react with aromatic-di-phenone compounds (represented by the general formula 3) to obtain the indole skeleton compounds represented by the general formula (4), where methods to form $R_5$ group are shown by the following scheme (2) or (3):

Scheme (2)

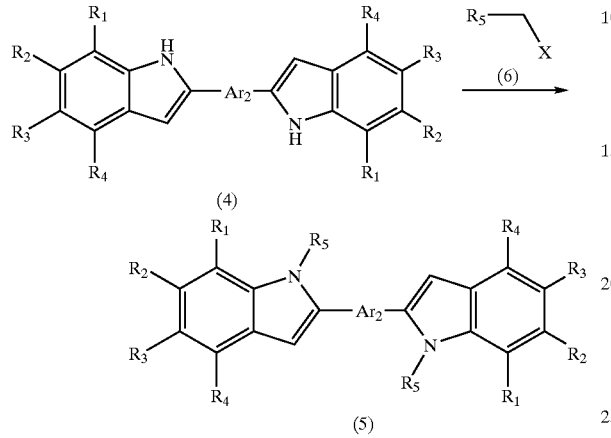

wherein R1 to R5 and Ar2 are the same as defined above, and X is a halogen atom.

Indole skeleton compounds represented by formula (4) react with alkylhalide represented by the general formula (6), and can obtain indole compounds represented by the general formula (5) (wherein R1 to R5 and Ar2 are the same as defined above):

Scheme (3)

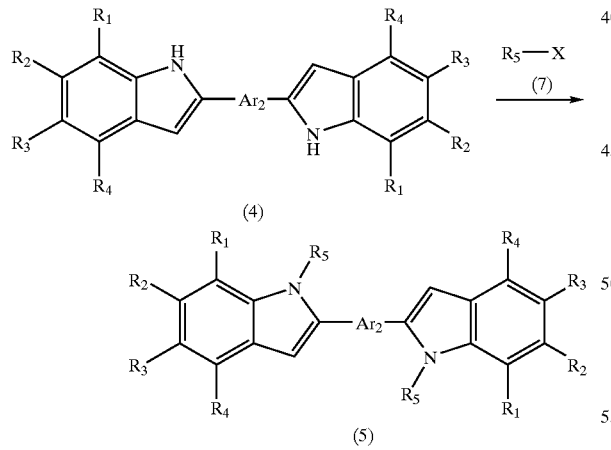

Indole skeleton compounds represented by formula (4) react with arylhalide compound compounds represented by the general formula (7), and can obtain indole compounds represented by the general formula (5).

As shown in the following scheme (4), indole skeleton compounds represented by the general formula (1) of the present invention can be obtained by the 2-step reactions:

Scheme (4)

Step (1):

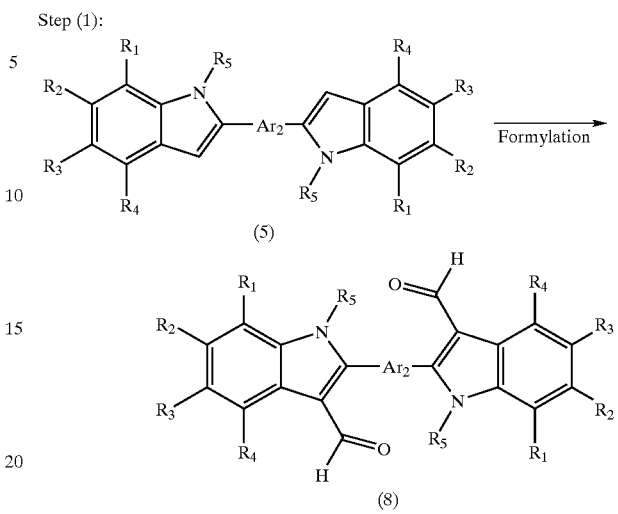

wherein R1 to R5 and Ar2 are the same as defined above.

Formylation of indole based compounds represented by the general formula (5) to get indole based aldehyde are represented by the following general formula (8) (wherein R1 to R5, Ar1, Ar2 and Y are the same as defined above):

Step (2):

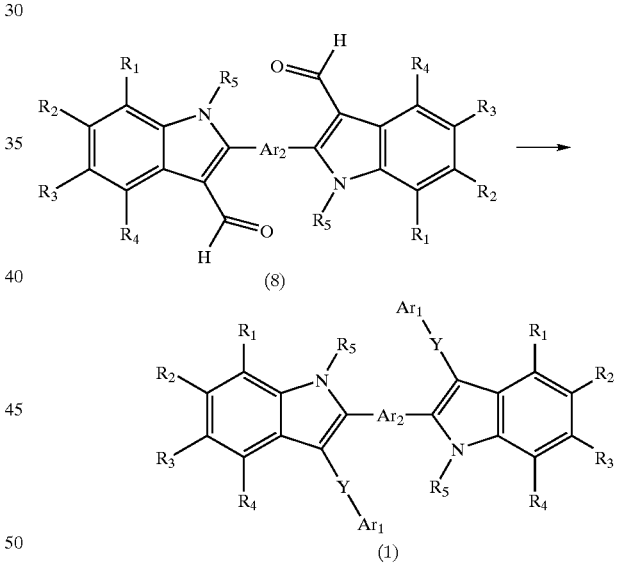

If indole based aldehyde represented by the general formula (8) reacts with a Wittig reagent having the following general formula (wherein Ar1 is the same as defined above):

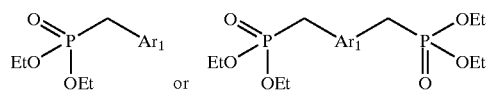

It gets indole skeleton compounds represented by the general formula (1), where the X is a —CH═CH— group.

If Indole based aldehyde represented by the general formula (8) reacts with amino aromatic compounds having the following general formula (wherein R6 to R9 are the same as defined R1):

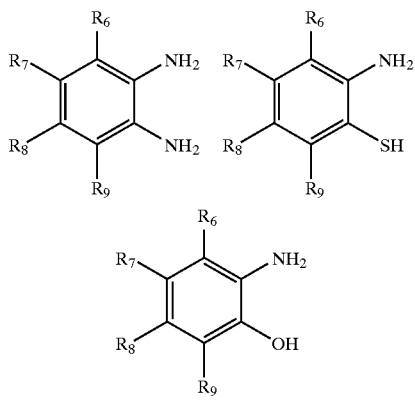

It gets indole skeleton based compounds represented by the general formula (1) where the X is a single bond.

The organic EL device according to the present invention has a multi-layered structure including a light emitting layer, hole transporting layers, and electron transporting layers.

Hole transporting layer contains one or more organic layers including a hole injection layer. A hole injection layer increases the light emitting performance by improving the hole injection from the anode into the organic layers, and improving the contact of anode with organic layers. Typical compounds for the hole injection materials include porphyrin compounds (U.S. Pat. No. 3,935,031 or U.S. Pat. No. 4,356,429) having the example structure (wherein M is a metal, metal oxide, or metal halide):

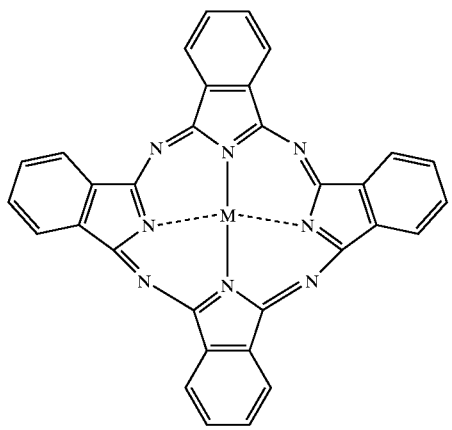

Aromatic tertiary amine compounds (U.S. Pat. Nos. 4,127,412, 6,047,734) include diarylamine or triarylamine having the example structures:

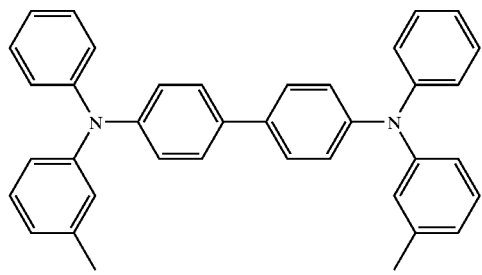

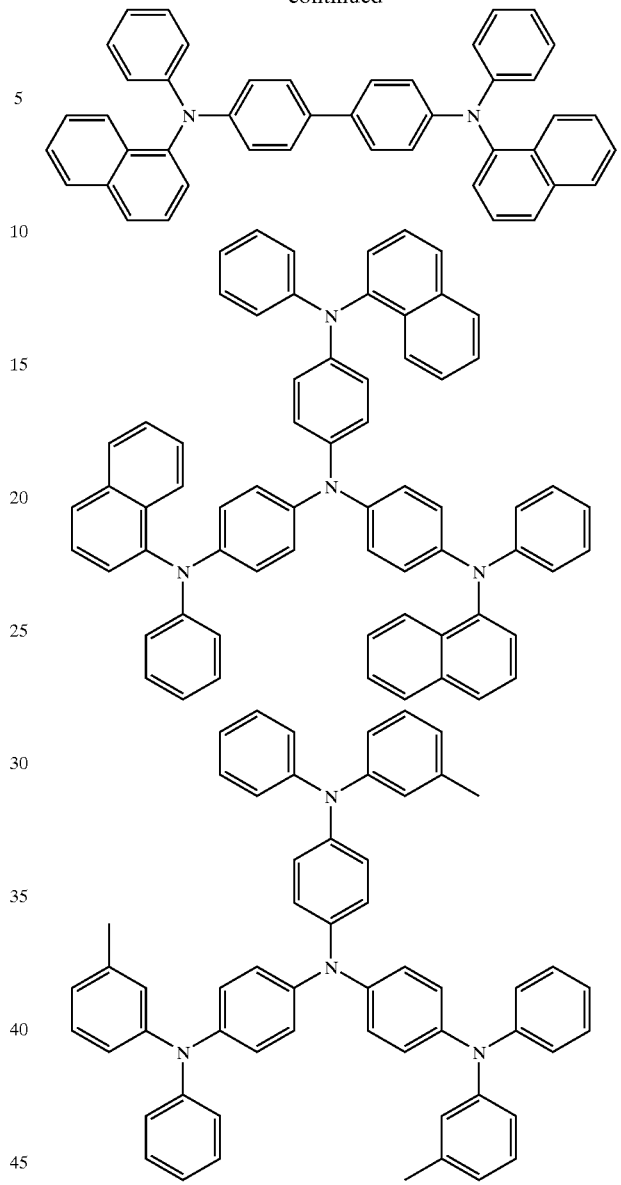

These compounds are suitable for both hole injection materials and hole transporting materials.

Electron transporting layer contains one or more organic layers to inject and transport electron from cathode into organic layer. An electron injection layer increases the light emitting property by improving the electron injection performance from the cathode into the organic layers. Typical compounds for the electron injection materials include oxadiazole compounds, triazine compounds and triazole compounds. Examples of these compounds are shown below:

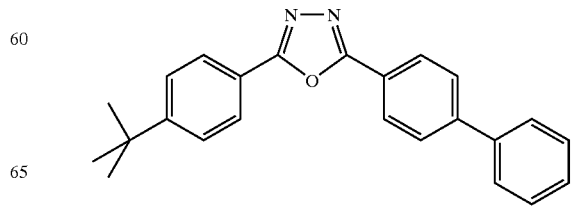

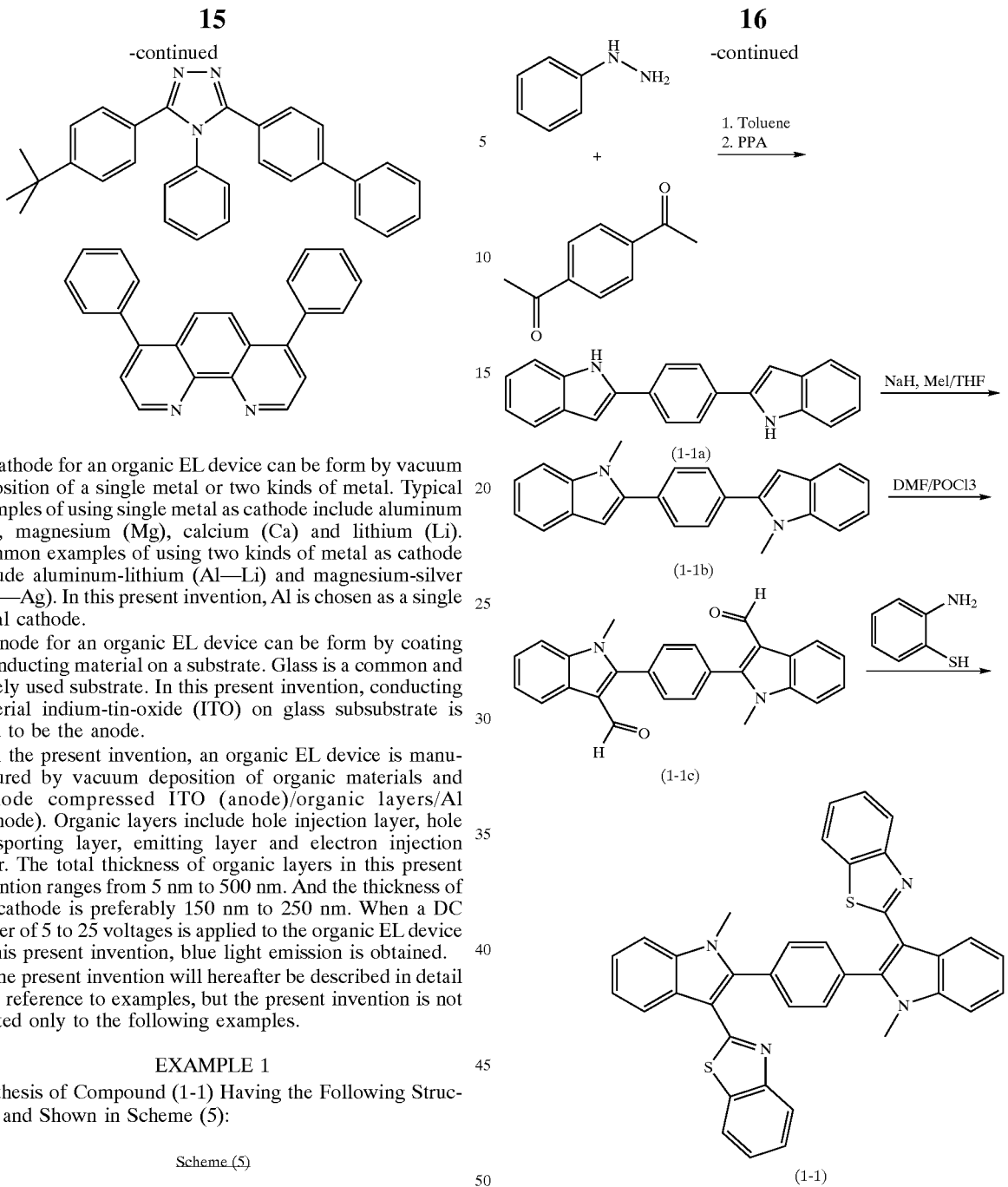

Cathode for an organic EL device can be form by vacuum deposition of a single metal or two kinds of metal. Typical examples of using single metal as cathode include aluminum (Al), magnesium (Mg), calcium (Ca) and lithium (Li). Common examples of using two kinds of metal as cathode include aluminum-lithium (Al—Li) and magnesium-silver (Mg—Ag). In this present invention, Al is chosen as a single metal cathode.

Anode for an organic EL device can be form by coating a conducting material on a substrate. Glass is a common and widely used substrate. In this present invention, conducting material indium-tin-oxide (ITO) on glass subsubstrate is used to be the anode.

In the present invention, an organic EL device is manufactured by vacuum deposition of organic materials and cathode compressed ITO (anode)/organic layers/Al (cathode). Organic layers include hole injection layer, hole transporting layer, emitting layer and electron injection layer. The total thickness of organic layers in this present invention ranges from 5 nm to 500 nm. And the thickness of the cathode is preferably 150 nm to 250 nm. When a DC power of 5 to 25 voltages is applied to the organic EL device in this present invention, blue light emission is obtained.

The present invention will hereafter be described in detail with reference to examples, but the present invention is not limited only to the following examples.

EXAMPLE 1

Synthesis of Compound (1-1) Having the Following Structure and Shown in Scheme (5):

$^1$H-NMR (CDCl$_3$, TMS) of compound (1-1) δ (ppm)=3.7 (s, 6H, —OMe), 7.1–7.7 (m, 16H, aromatic H), 8.0, 8.8 (d,d 2H,2H, aromatic H), with photoluminescence spectrum is shown in FIG. (2).

The organic EL device in the example uses the compound (1-1) as the light emitting material. The example uses the glass substrates with ITO electrode having a surface resistance of 20 (Ω/□) as the anode.

Device Example 1-1

As shown in FIG. 1, a 60 nm organic layer 12 is formed on the ITO 11 as the hole-transporting layer by vacuum deposition of NPB having the following structure:

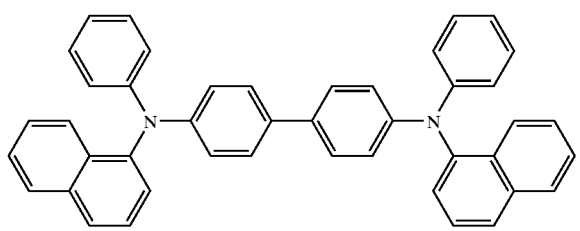

Over the hole-transporting layer 12, a 30 nm emitting layer 13 is formed by vacuum deposition of a compound (1-1) on the hole-transporting layer 12. Then, a 20 nm electron-transporting layer 14 is formed on the emitting layer 13 by vacuum deposition of Bphen having the following structure:

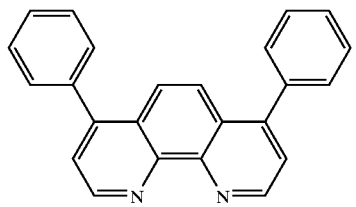

Figure 3:
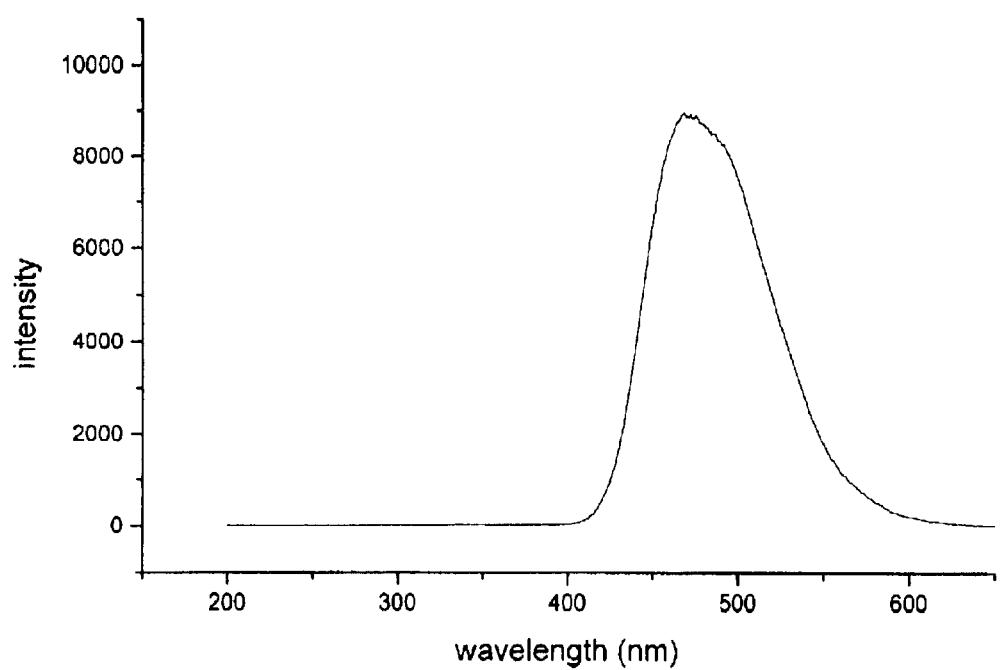
FIG. 3 illustrates the EL spectrum of device example 1-1.

Over the electron-transporting layer 14, a 0.8 nm electron-injection layer 15 was form by vacuum deposition of LiF. Finally, a 150 nm aluminum cathode 16 is formed by vacuum deposition on the electron-injection layer 15. When a dc voltage of 13 V is applied to the resulting device, a 3800 cd/m² brightness light emission is obtained. The EL spectrum is shown in FIG. 3.

Device Example 1-2

In the similar manner as applied to device Example 1-1, an electron-transporting layer 14 was form by vacuum deposition Alq3 having the following structure:

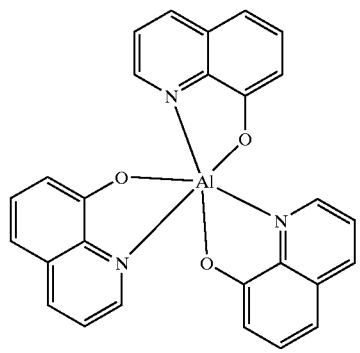

Figure 4:
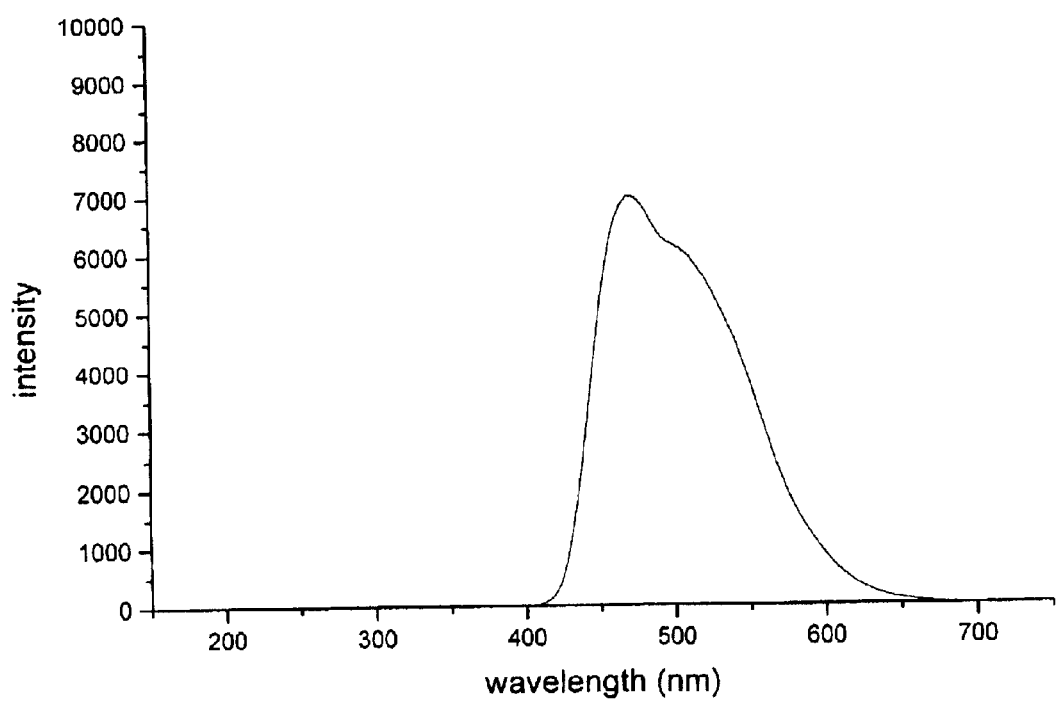
FIG. 4 illustrates the EL spectrum of device example 1-2.

When a dc voltage of 13 V is applied to the resulting device, a 4600 cd/m² brightness light emission is obtained. The EL spectrum is shown in FIG. 4.

EXAMPLE 2

Synthesis of Indole Based Compound (1-5) Having the Following Structure is Shown in Scheme (6).

Scheme (6)

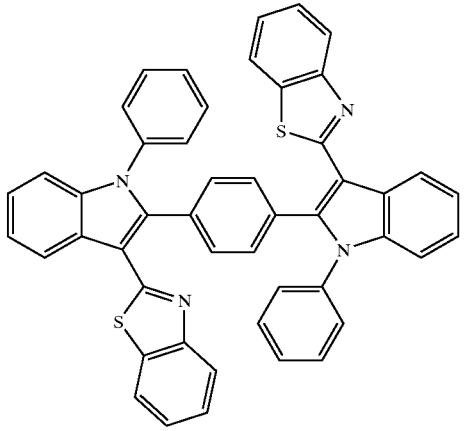

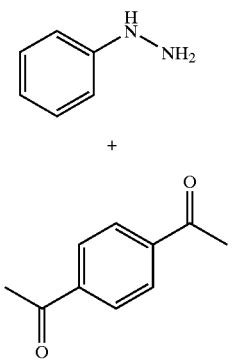

1. Toluene
2. PPA

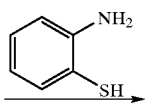

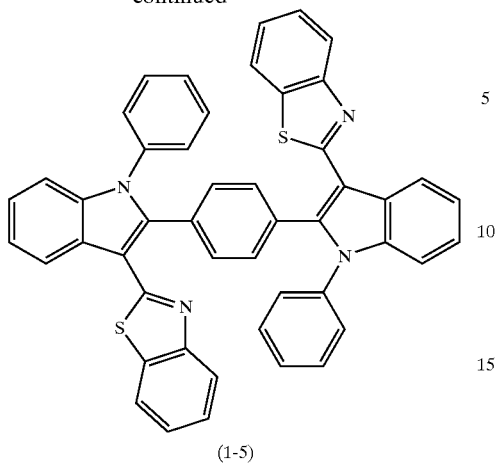

(1-5)

¹H-NMR (CDCl₃, TMS) of compound (1-5): δ (ppm)= 7.1–7.8 (m, 26H, aromatic H), 8.1, 8.8 (d,d 2H,2H, aromatic H).

Figure 5:
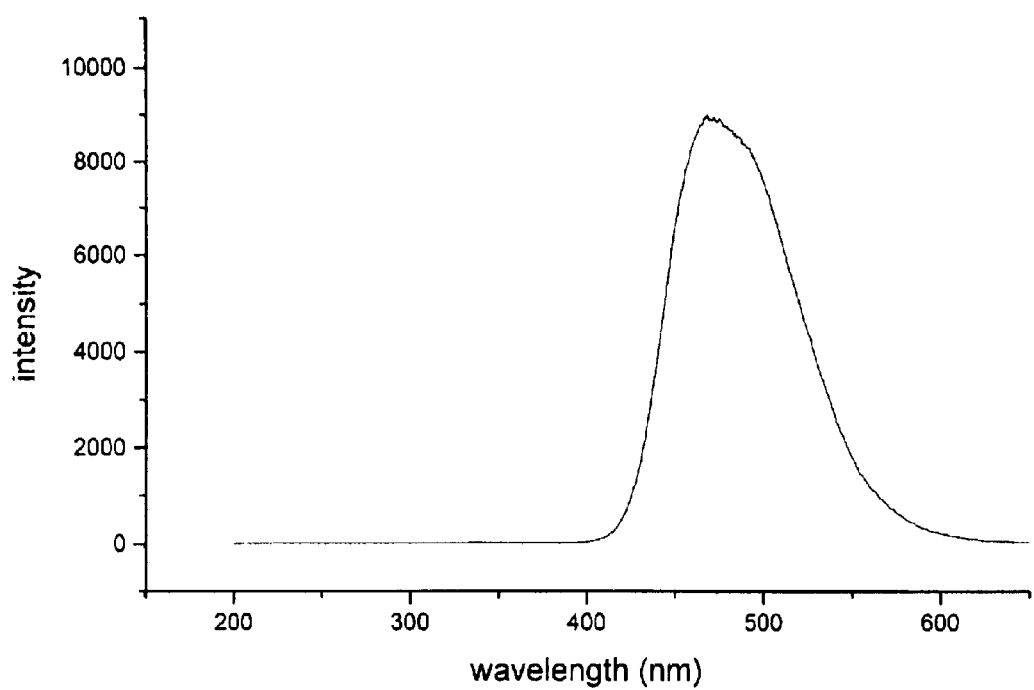
FIG. 5 illustrates the solid state PL spectrum of compound (1-5)

Photoluminescence Spectrum is Shown in FIG. 5.

Organic EL device example using compound (1-5) as light emitting material.

Device example 2-1

Figure 6:
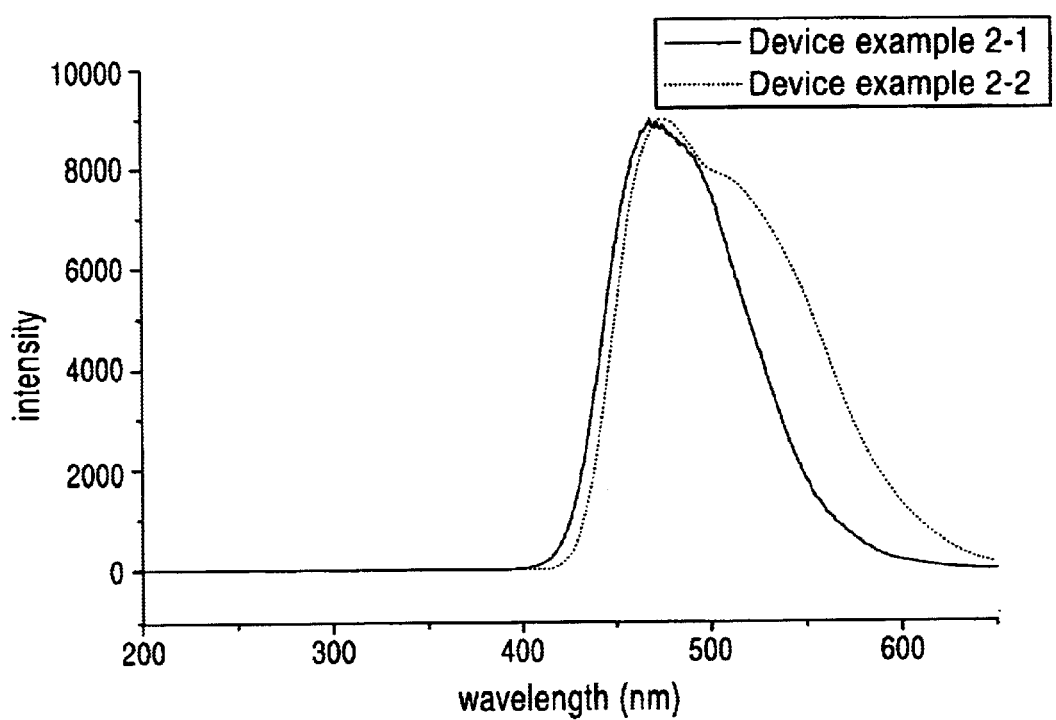
FIG. 6 illustrates the EL spectrum of device example 2-1 and 2-2.

In the similar manner as applied to device example 1-1, an emitting layer is formed by a vacuum deposition of compound (1-5). When a dc voltage of 13 V is applied to the resulting device, a 4200 cd/m² brightness light emission is obtained. The EL spectrum is shown in FIG. 6.

Device Example 2-2

In a similar manner as applied to Device Example 1-2, an emitting layer is formed by vacuum deposition of compound (1-5). When a dc voltage of 13 V is applied to the resulting device, a 4700 cd/m² brightness light emission is obtained. The EL spectrum is shown in FIG. 6.

EXAMPLE 3

Synthesis of Indole Based Compound (1-11) Having the Following Structure is Shown in Scheme (7).

Scheme (7)

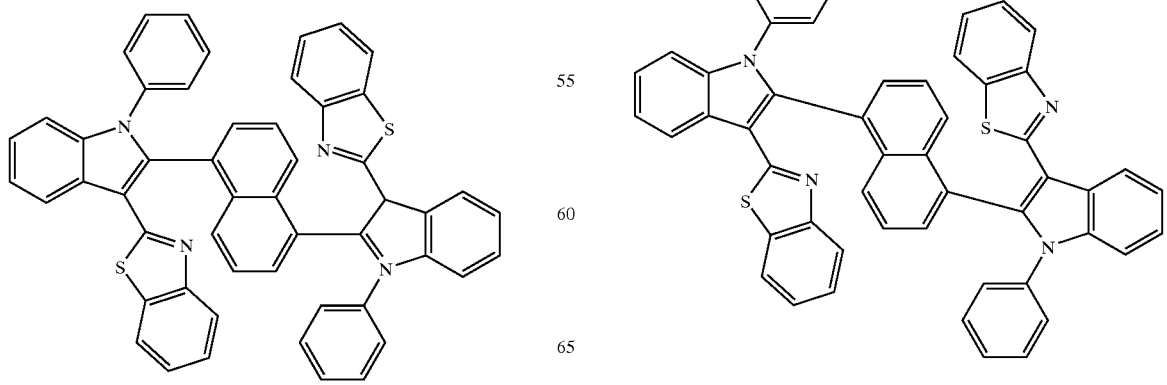

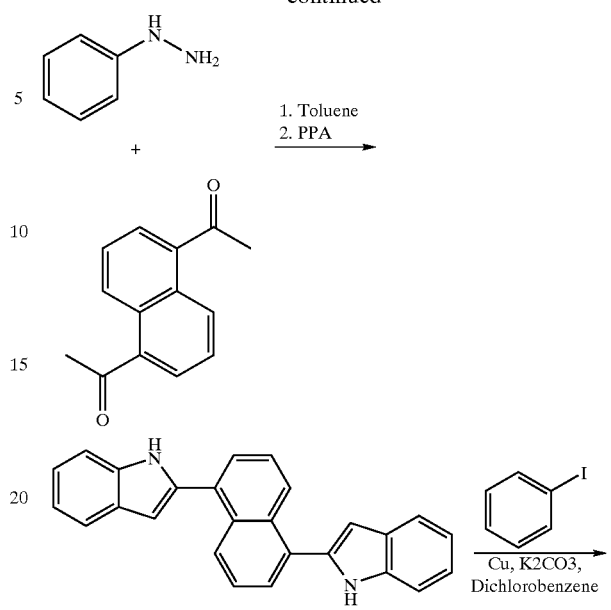

$^1$H-NMR (CDCl$_3$, TMS) of compound (1-11): δ (ppm)= 7.0–7.9 (m, 28H, aromatic H), 8.1, 8.9 (d,d 2H,2H, aromatic H).

Figure 7:
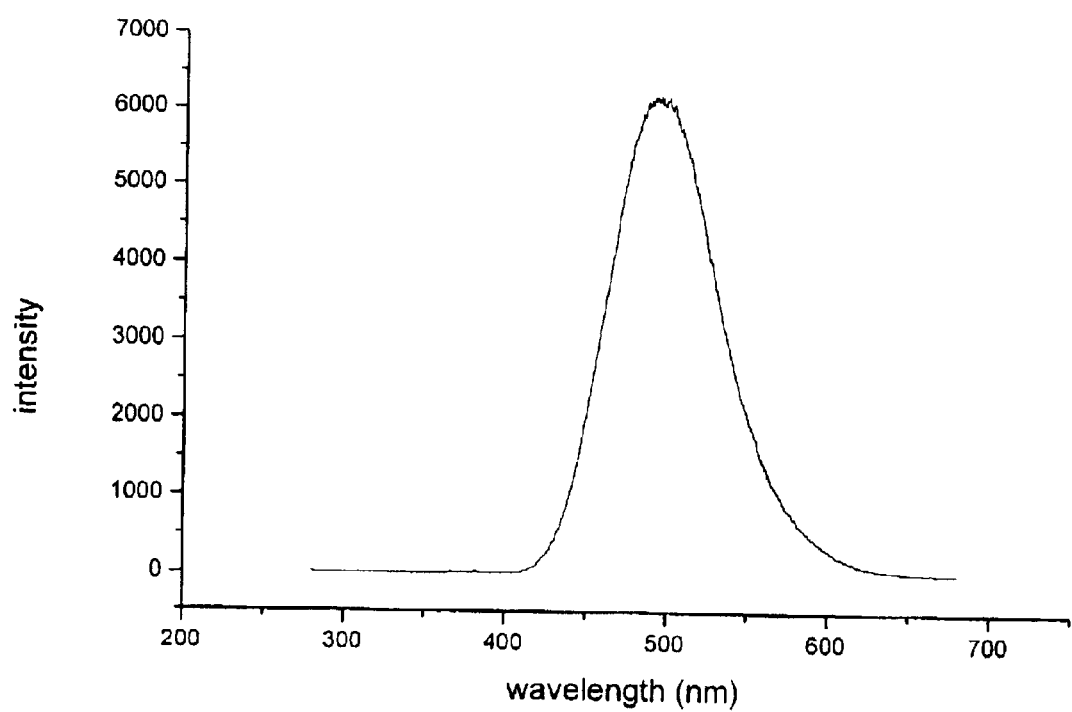
FIG. 7 illustrates the solid state PL spectrum of compound (1-11)

Photoluminescence Spectrum is Shown in FIG. 7.

The Organic EL device in the example uses the compound (1-11) as light emitting material.

Device Example 3-1

Figure 8:
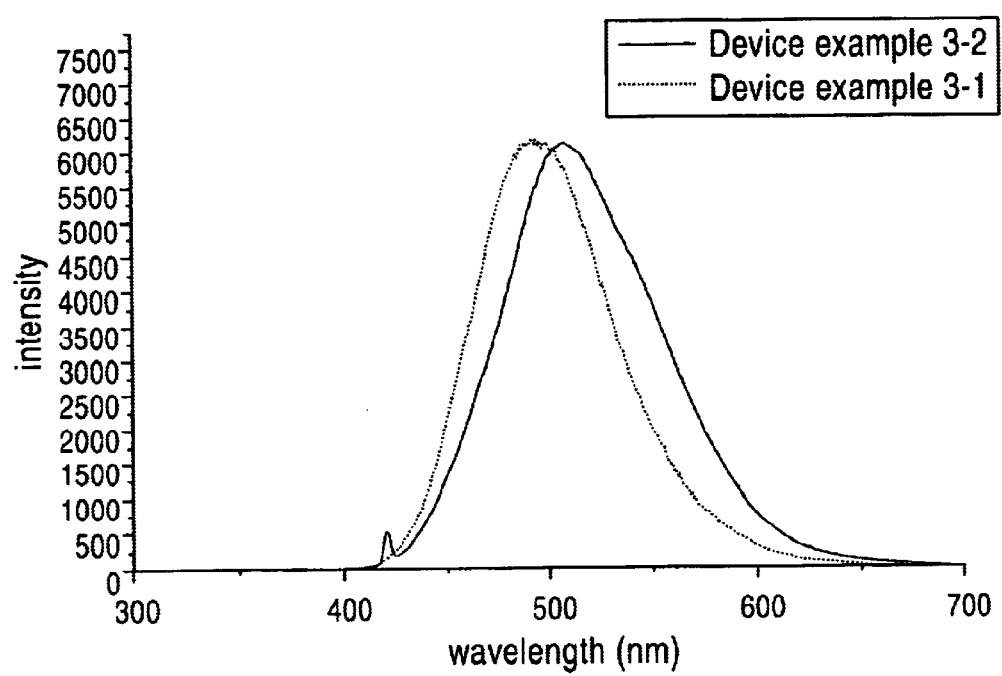
FIG. 8 illustrates the EL spectrum of device example 3-1 and 3-2.

In the similar manner as applied to Device Example 1-1, an emitting layer is formed by vacuum deposition of compound (1-11). When a dc voltage of 13 V is applied to the resulting device, a 4150 cd/m$^2$ brightness light emission is obtained. The EL spectrum is shown in FIG. 8.

Device Example 3-2

In the similar manner as applied to Device Example 1-2, an emitting layer is formed by vacuum deposition of compound (1-11). When a dc voltage of 13 V is applied to the resulting device, a 4400 cd/m$^2$ brightness light emission is obtained. The EL spectrum is shown in FIG. 8.

EXAMPLE 4

Synthesis of Indole Based Compound (1-19) Having the Following Structure is Shown in Scheme (8).

Scheme (8)

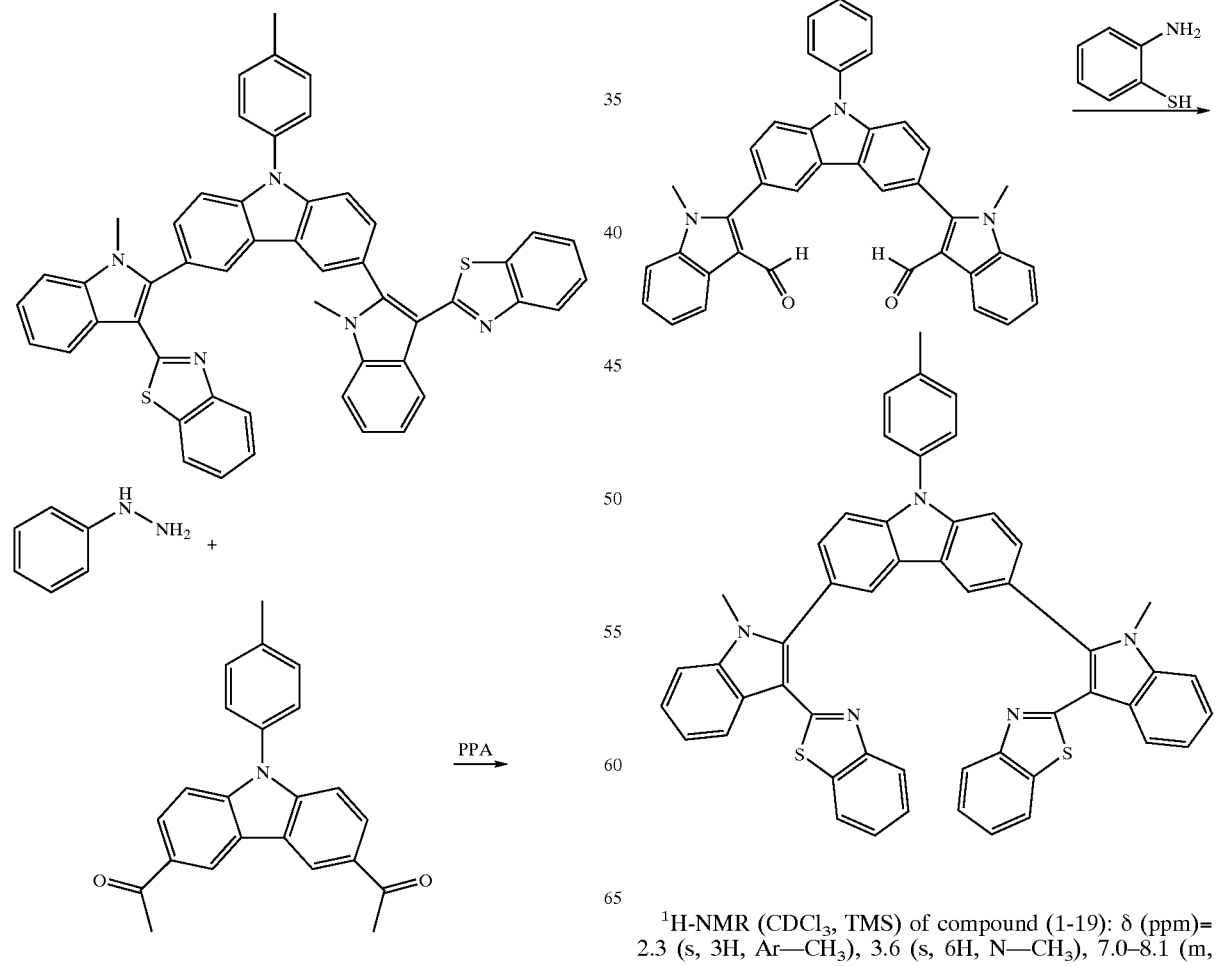

$^1$H-NMR (CDCl$_3$, TMS) of compound (1-19): δ (ppm)= 2.3 (s, 3H, Ar—CH$_3$), 3.6 (s, 6H, N—CH$_3$), 7.0–8.1 (m, 18H, aromatic H), 8.2, 8.4 (d, d, 2H, 2H, carbazol H), 8.7 (s, 2H, carbazol H), 8.9 (d, 2H, aromatic H).

Figure 9:
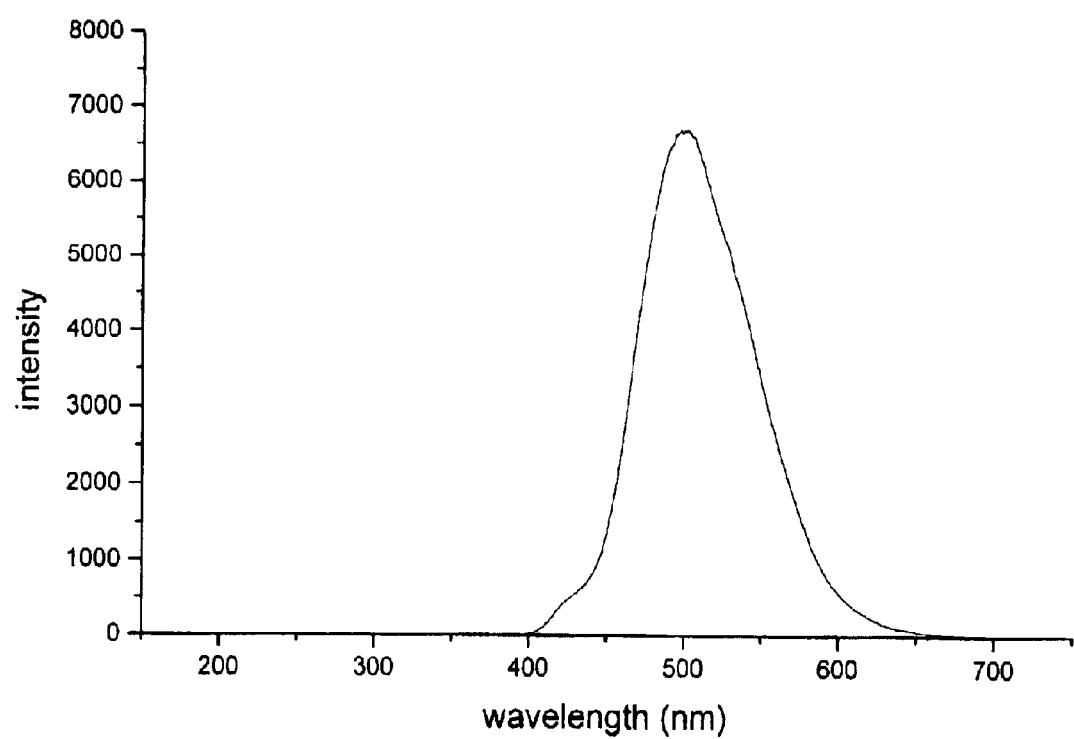
FIG. 9 illustrates the solid state PL spectrum of compound (1-19)

Photoluminescence Spectrum is Shown in FIG. 9.

Figure 10:
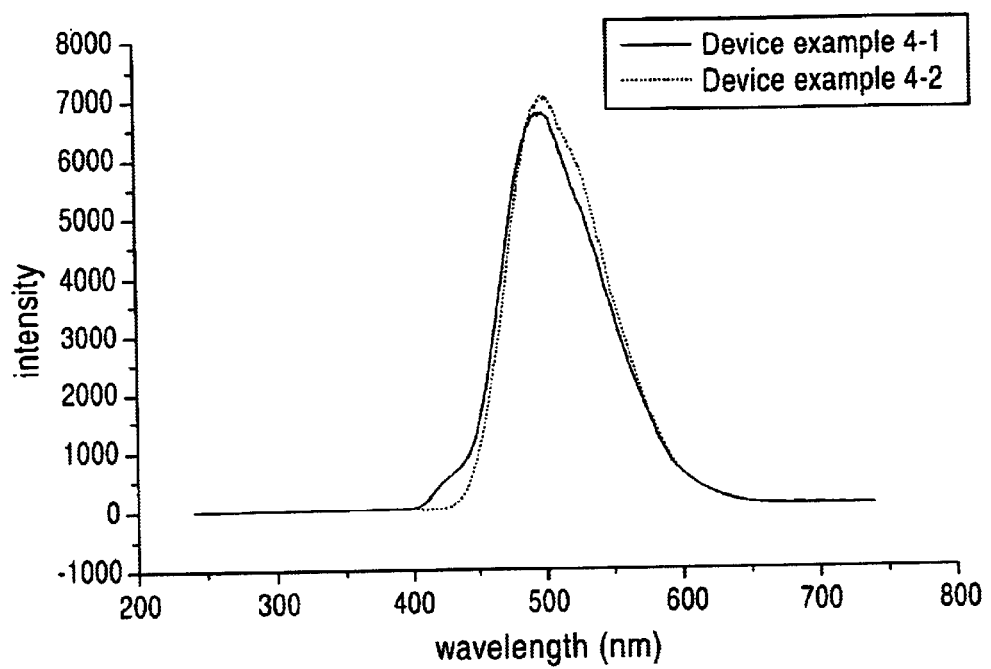
FIG. 10 illustrates the EL spectrum of device example 4-1 and 4-2.

The Organic EL device in the example uses the compound (1-19) as the light emitting material device Example 4-1:

In the similar manner as applied to Device Example 1-1, an emitting layer is formed by vacuum deposition of compound (1-19). When a dc voltage of 13 V is applied to the resulting device, a 4450 cd/m² brightness light emission is obtained. The EL spectrum is shown in FIG. 10.

Device Example 4-2

In the similar manner as applied to Device Example 1-2, an emitting layer is formed by vacuum deposition of compound (1-19). When a dc voltage of 13 V is applied to the resulting device, a 4800 cd/m² brightness light emission is obtained. The EL spectrum is shown in FIG. 10.

Reviewing the above organic EL device examples of this present invention, it is pointed out that blue to blue-green organic EL device can be obtained when containing a light emitting material having the general formula (1):

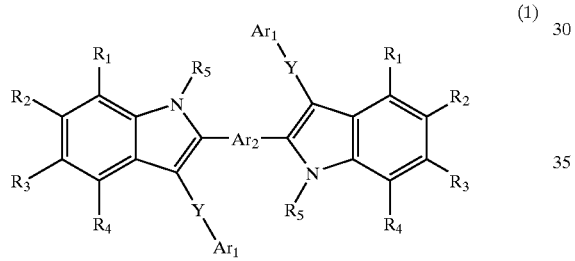

(1)

Particularly, $Ar_1$, $Ahd2$ represent a substituted or unsubstituted aromatic hydrocarbon group, or a substituted or unsubstituted aromatic heterocyclic group; Y represents a single bond or —CH═CH— group; R1 to R4 represent Independently a hydrogen, a halogen, a cyano group, a substituted amino group, a substituted alkoxy group, a substituted or unsubstituted alkyl group, a substituted or unsubstituted aromatic hydrocarbon group, or a substituted or unsubstituted aromatic heterocyclic group; any two of R1 to R4 may form a ring; R5 represents a substituted or unsubstituted alkyl group, a substituted or unsubstituted aromatic hydrocarbon group, or a substituted or unsubstituted aromatic heterocyclic group.

What is claimed is:
1. An organic EL device comprising:

an anode;
a cathode; and
one or more organic thin film layers including a light emitting layer adjacent to said anode and said cathode,
wherein at least one of the said organic thin film layers contains a compound represented by the following formula (1B):

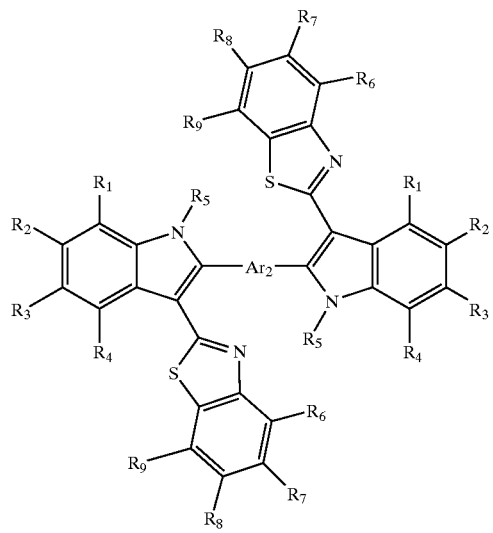

(1B)

wherein $Ar_2$ represents a substituted or unsubstituted aromatic hydrocarbon group, or a substituted or unsubstituted aromatic heterocyclic group; R1 to R4 and R6 to R9 represent independently a hydrogen, a halogen, a cyano group, a substituted a mino group, a substituted alkoxy group, a substituted or unsubstituted alkyl group, a substituted or unsubstituted aromatic hydrocarbon group, or a substituted or unsubstituted aromatic heterocyclic group; R5 represents a substituted or unsubstituted alkyl group, a substituted or unsubstituted aromatic hydrocarbon group, or a substituted or unsubstituted aromatic heterocyclic group.

2. An organic EL device comprising:
an anode;
a cathode; and
one or more organic thin film layers including a light emitting layer adjacent to said anode and said cathode,
wherein at least one of the said organic thin film layers contains a compound represented by the following formula (1C)

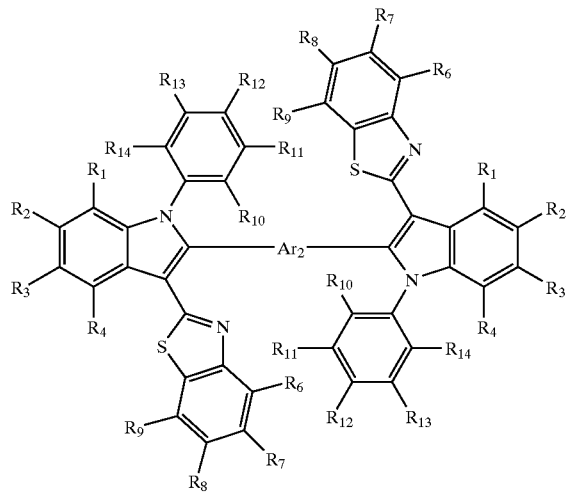

(1C)

wherein Ar$_2$ represents a substituted or unsubstituted aromatic hydrocarbon group, or a substituted or unsubstituted aromatic heterocyclic group; R1 to R4 and R6 to R14 represent independently a hydrogen, a halogen, a cyano group, a substituted amino group, a substituted alkoxy group, a substituted or unsubstituted alkyl group, a substituted or unsubstituted aromatic hydrocarbon group, or a substituted or unsubstituted aromatic heterocyclic group.

* * * * *